(12) United States Patent
Shigyo et al.

(10) Patent No.: US 7,999,324 B2
(45) Date of Patent: Aug. 16, 2011

(54) SEMICONDUCTOR DEVICE INCLUDING OVERCURRENT PROTECTION ELEMENT

(75) Inventors: Naoyuki Shigyo, Yokohama (JP); Kentaro Watanabe, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 775 days.

(21) Appl. No.: 11/291,436

(22) Filed: Nov. 30, 2005

(65) Prior Publication Data

US 2006/0125023 A1    Jun. 15, 2006

(30) Foreign Application Priority Data

Dec. 10, 2004    (JP) .................. 2004-358833

(51) Int. Cl.
*H01L 23/62* (2006.01)
*H01L 29/76* (2006.01)
(52) U.S. Cl. .. 257/360; 257/363; 257/384; 257/E29.012
(58) Field of Classification Search .................. 257/363, 257/360, 358, 384, E29.141, E29.012
See application file for complete search history.

(56) References Cited

U.S. PATENT DOCUMENTS

| 5,440,162 | A | * | 8/1995 | Worley et al. | 257/355 |
| 5,468,667 | A |   | 11/1995 | Diaz et al. | |
| 5,498,892 | A | * | 3/1996 | Walker et al. | 257/336 |
| 5,663,678 | A | * | 9/1997 | Chang | 327/566 |
| 6,022,769 | A | * | 2/2000 | Wu | 438/200 |
| 6,100,125 | A | * | 8/2000 | Hulfachor et al. | 438/224 |
| 6,476,449 | B1 | * | 11/2002 | Lin | 257/360 |
| 6,740,936 | B1 |   | 5/2004 | Gitlin et al. | |
| 6,787,880 | B2 | * | 9/2004 | Hu et al. | 257/576 |

FOREIGN PATENT DOCUMENTS

| JP | 05-067737 | 3/1993 |
| JP | 07-058319 | 3/1995 |
| JP | 07-153945 | 6/1995 |
| JP | 08-279597 | 10/1996 |
| JP | 09-148452 | 6/1997 |
| JP | 10-012746 | 1/1998 |
| JP | 10-321842 | 12/1998 |
| JP | 3319445 | 6/2000 |
| JP | 2001-168206 | 6/2001 |
| JP | 2002-134630 | 5/2002 |
| JP | 2002-334990 | 11/2002 |
| JP | 2004-273973 | 9/2004 |

OTHER PUBLICATIONS

Office Action from JPO in corresponding Japanese Patent Application No. 2004-358833 dated Jun. 7, 2011, and English language translation thereof, 8 pages.

* cited by examiner

*Primary Examiner* — Shouxiang Hu
(74) *Attorney, Agent, or Firm* — DLA Piper LLP (US)

(57) ABSTRACT

A semiconductor device includes first, second, third, and fourth semiconductor regions, a gate electrode, and silicide layers. The first, second, and third semiconductor regions are formed in a semiconductor substrate while being spaced part from each other. The fourth semiconductor region is formed in the semiconductor substrate between the second semiconductor region and the third semiconductor region and has an electric resistance higher than the first, second, and third semiconductor regions. In a direction perpendicular to a direction to connect the first and second semiconductor regions, the fourth semiconductor region has a width smaller than that of the semiconductor substrate sandwiched between the first semiconductor region and the second semiconductor region. The gate electrode is formed above the semiconductor substrate between the first semiconductor region and the second semiconductor region. The silicide layer is formed on each of the first, second, third semiconductor regions and the gate electrode.

7 Claims, 5 Drawing Sheets

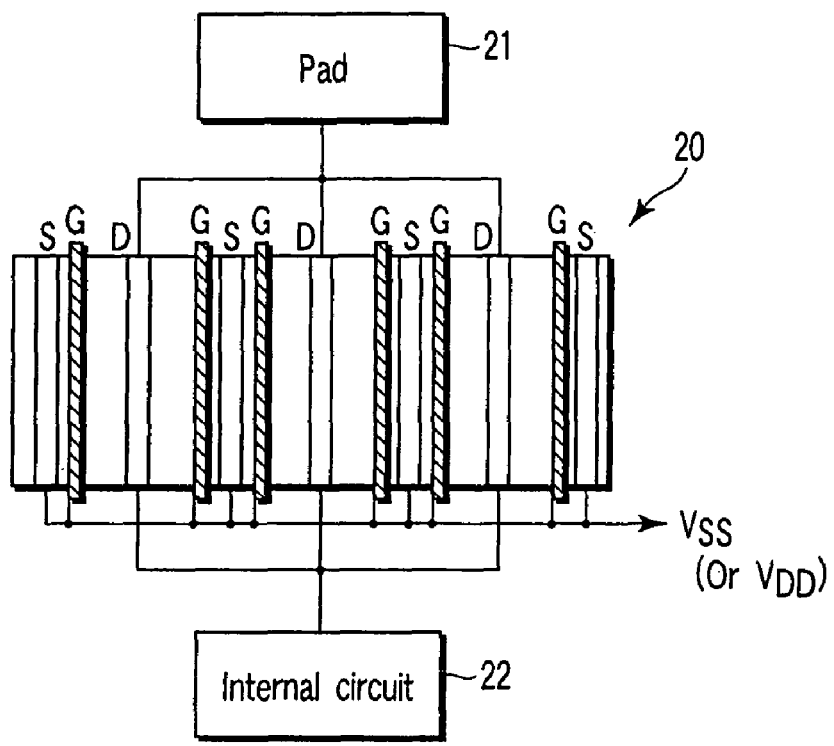
F I G. 4
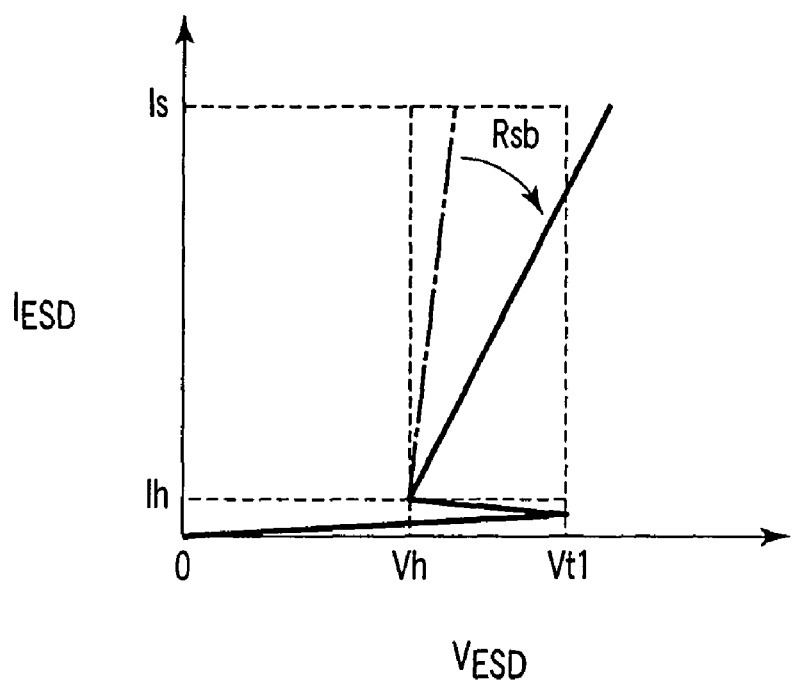
F I G. 5

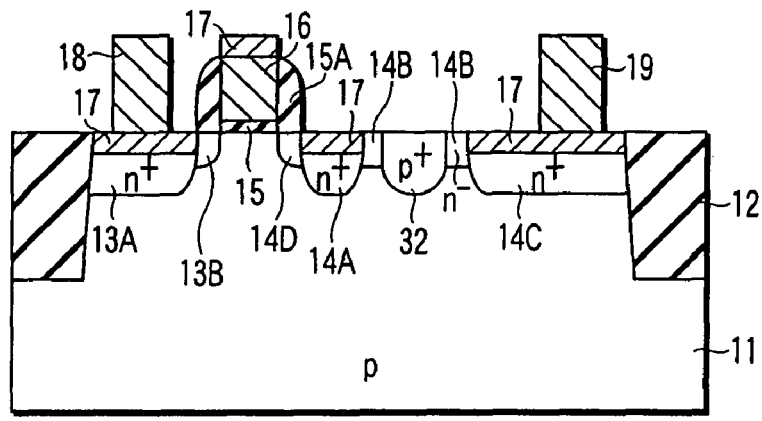
F I G. 9
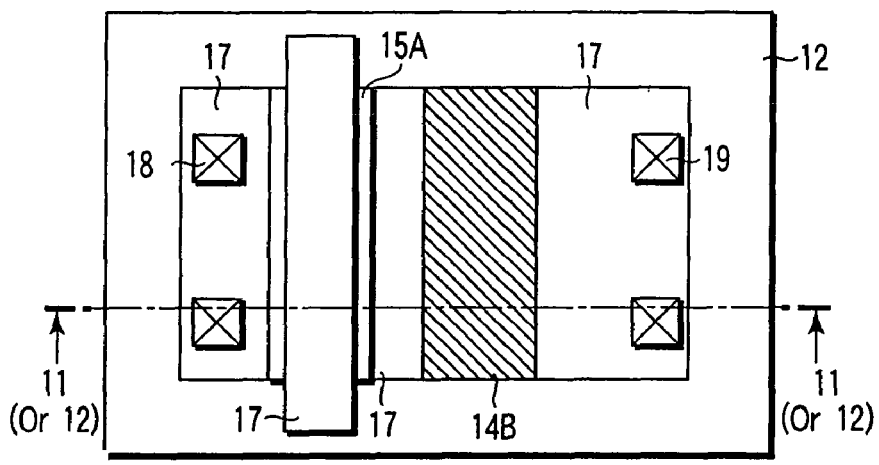
F I G. 10
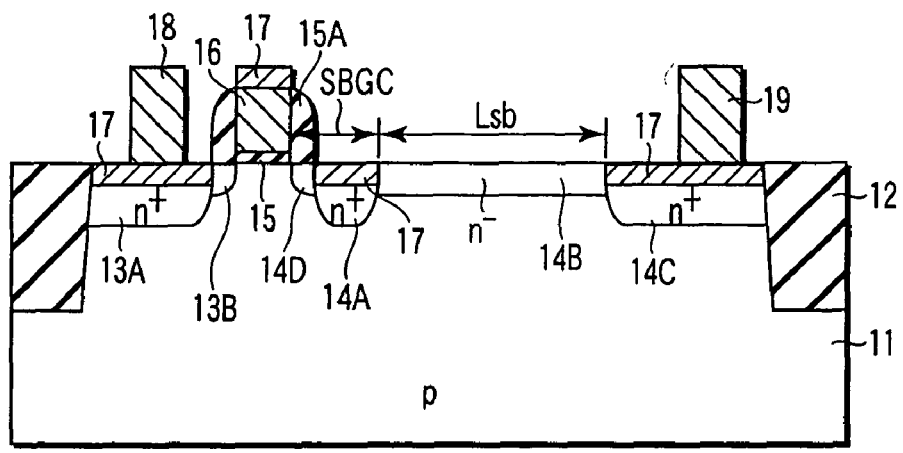
F I G. 11

SEMICONDUCTOR DEVICE INCLUDING OVERCURRENT PROTECTION ELEMENT

CROSS-REFERENCE TO RELATED APPLICATIONS

This application is based upon and claims the benefit of priority from prior Japanese Patent Application No. 2004-358833, filed Dec. 10, 2004, the entire contents of which are incorporated herein by reference.

BACKGROUND OF THE INVENTION

1. Field of the Invention

The present invention relates to a semiconductor device and, for example, to a semiconductor device including an overcurrent protection element to prevent an overcurrent from flowing in the semiconductor device by a surge.

2. Description of the Related Art

Along with the recent progress of the techniques for micro-patterning a MOS field effect transistor (to be referred to as a MOSFET hereinafter) and thinning a gate insulating film by decreasing the voltage, the importance of electrostatic destroy (ESD) protection elements which protect a gate insulating film from ESD is growing.

Some ESD protection elements are formed from a MOSFET in which the drain diffusion layer has, at a part, a salicide block region with no salicide cover. For example, a MOSFET, which forms a protection element, has a salicide block region to protect the gate insulating film from ESD, as shown in FIG. 1B of Japanese Patent No. 3319445, so that a salicide length L2 on the drain diffusion layer adjacent to the gate electrode becomes shorter than a gate length L1, thereby suppressing current crowding by salicide.

FIG. 4 shows the circuit structure of a protection element with a finger structure formed by a plurality of MOSFETs. When the overcurrent protection element with a finger structure is formed by using a plurality of MOSFETs shown in FIG. 4, the plurality of MOSFETs cannot uniformly be turned on because values of a trigger voltage Vt1 of the MOSFETs vary. For this reason, an overcurrent flows into only some of the MOSFETs, so that they are destroyed. Hence, the overcurrent cannot be discharged.

To uniformly turn on the plurality of MOSFETs to prevent the overcurrent from flowing into only some of them, the resistance of the drain region must be maintained at a predetermined value or more. In addition, the plurality of MOSFETs must be turned on before the current flowing to some of them reaches a breakdown current. However, even in the MOSFET having the above-described structure, it is difficult to maintain the resistance of the drain region, which decreases along with size reduction of a MOSFET.

BRIEF SUMMARY OF THE INVENTION

According to a first aspect of the present invention, there is provided a semiconductor device comprising: a first semiconductor region formed in a semiconductor substrate; a second semiconductor region formed in the semiconductor substrate while being spaced apart from the first semiconductor region; a third semiconductor region formed in the semiconductor substrate while being spaced apart from the second semiconductor region; a fourth semiconductor region formed in the semiconductor substrate between the second semiconductor region and the third semiconductor region, the fourth semiconductor region having an electric resistance higher than that of the first semiconductor region, second semiconductor region, and third semiconductor region, and in a direction perpendicular to a direction to connect the first semiconductor region and the second semiconductor region, the fourth semiconductor region having a width smaller than that of the semiconductor substrate sandwiched between the first semiconductor region and the second semiconductor region; a gate insulating film formed on the semiconductor substrate between the first semiconductor region and the second semiconductor region; a gate electrode formed on the gate insulating film; and a silicide layer formed on each of the first semiconductor region, second semiconductor region, third semiconductor region, and gate electrode.

According to a second aspect of the present invention, there is provided a semiconductor device comprising: a first semiconductor region formed in a semiconductor substrate; a second semiconductor region formed in the semiconductor substrate while being spaced apart from the first semiconductor region; a third semiconductor region formed in the semiconductor substrate while being spaced apart from the second semiconductor region; a fourth semiconductor region formed in the semiconductor substrate between the second semiconductor region and the third semiconductor region, the fourth semiconductor region having an electric resistance higher than that of the first semiconductor region, second semiconductor region, and third semiconductor region; an insulating region formed in the fourth semiconductor region; a gate insulating film formed on the semiconductor substrate between the first semiconductor region and the second semiconductor region; a gate electrode formed on the gate insulating film; and a silicide layer formed on each of the first semiconductor region, second semiconductor region, third semiconductor region, and gate electrode.

According to a third aspect of the present invention, there is provided a semiconductor device comprising: a first semiconductor region formed in a semiconductor substrate; a second semiconductor region formed in the semiconductor substrate while being spaced apart from the first semiconductor region; a third semiconductor region formed in the semiconductor substrate while being spaced apart from the second semiconductor region; a fourth semiconductor region formed in the semiconductor substrate between the second semiconductor region and the third semiconductor region, the fourth semiconductor region having an electric resistance higher than that of the first semiconductor region, second semiconductor region, and third semiconductor region; a fifth semiconductor region formed in the fourth semiconductor region and has a conductivity type opposite to the fourth semiconductor region; a gate insulating film formed on the semiconductor substrate between the first semiconductor region and the second semiconductor region; a gate electrode formed on the gate insulating film; and a silicide layer formed on each of the first semiconductor region, second semiconductor region, third semiconductor region, and gate electrode.

According to a fourth aspect of the present invention, there is provided a semiconductor device comprising: a first semiconductor region formed in a semiconductor substrate; a second semiconductor region formed in the semiconductor substrate while being spaced apart from the first semiconductor region; a third semiconductor region formed in the semiconductor substrate while being spaced apart from the second semiconductor region; a gate insulating film formed on the semiconductor substrate between the first semiconductor region and the second semiconductor region; a gate electrode formed on the gate insulating film; a fourth semiconductor region formed in the semiconductor substrate between the second semiconductor region and the third semiconductor region, the fourth semiconductor region having an electric resistance higher than that of the first semiconductor region, second semiconductor region, and third semiconductor region, and in a direction to connect the first semiconductor region and the second semiconductor region, the fourth semiconductor region having a length larger than a distance between the gate electrode and the fourth semiconductor region; and a silicide layer formed on each of the first semiconductor region, second semiconductor region, third semiconductor region, and gate electrode.

BRIEF DESCRIPTION OF THE SEVERAL VIEWS OF THE DRAWING

FIG. 4 is a view showing the circuit structure of a semiconductor device including a protection element with a finger structure according to an embodiment of the present invention;

FIG. 5 is a graph showing the voltage vs. current characteristic of the semiconductor device according to the embodiment of the present invention;

FIG. 9 is a sectional view taken along a line 9-9 in the semiconductor device according to the third embodiment;

FIG. 10 is a plan view showing the structure of a semiconductor device according to a fourth and fifth embodiments of the present invention;

FIG. 11 is a sectional view taken along a line 11-11 in the semiconductor device according to the fourth embodiment;

DETAILED DESCRIPTION OF THE INVENTION

Figure 1:
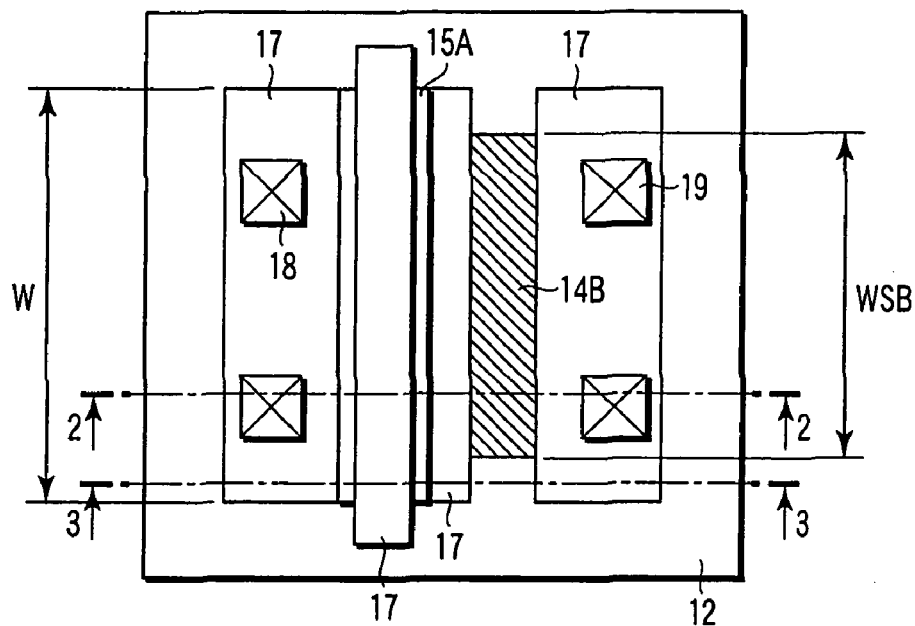
FIG. 1 is a plan view showing the structure of a semiconductor device according to a first embodiment of the present invention.

Semiconductor devices according to the embodiments of the present invention will be described below with reference to the accompanying drawing. In the following description, the same reference numerals denote the same parts throughout the drawing.

First Embodiment

A semiconductor device including a protection element according to the first embodiment of the present invention will be described. In the following example, the protection element is formed from an n-channel MOS field effect transistor (to be referred to as an nMOS transistor hereinafter).

Figure 2:
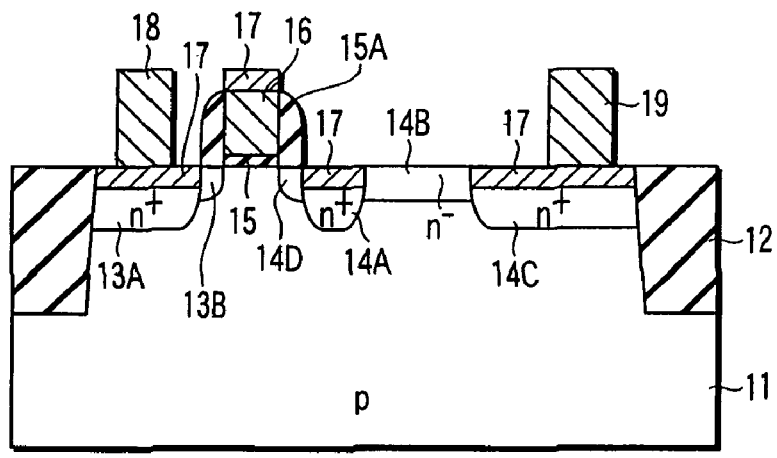
FIG. 2 is a sectional view taken along a line 2-2 in the semiconductor device according to the first embodiment.
Figure 3:
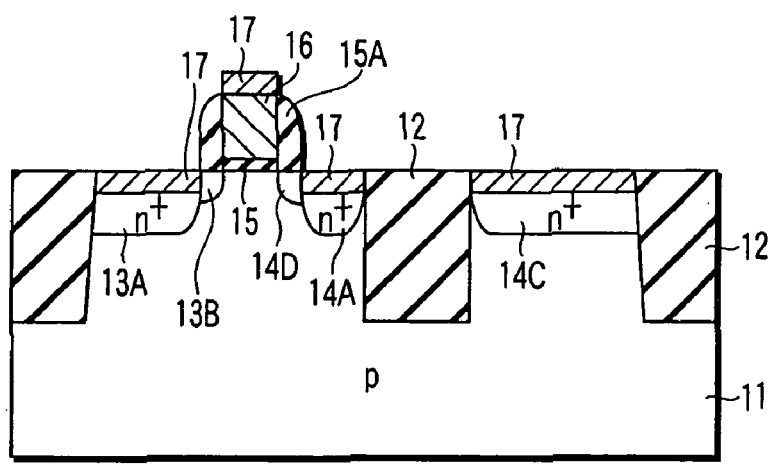
FIG. 3 is a sectional view taken along a line 3-3 in the semiconductor device according to the first embodiment.

FIG. 1 is a plan view showing the structure of an nMOS transistor included in the protection element according to the first embodiment. FIG. 2 is a sectional view taken along a line 2-2 in the nMOS transistor. FIG. 3 is a sectional view taken along a line 3-3 in the nMOS transistor.

As shown in FIG. 2, an element isolation region 12 is arranged in a p-type silicon semiconductor substrate 11. The element isolation region 12 includes a shallow trench isolation (STI) formed by, e.g., burying a silicon oxide film in a trench formed in the p-type semiconductor substrate 11. The element isolation region 12 electrically insulates nMOS transistors (elements) formed on the p-type semiconductor substrate 11 to define an element region where an nMOS transistor is formed.

A source region including an $n^+$-type semiconductor region 13A and a drain region including an $n^+$-type semiconductor region 14A, $n^-$-type semiconductor region 14B, and $n^+$-type semiconductor region 14C are formed in the surface region of the p-type semiconductor substrate 11 in the element region while being spaced apart from each other. The $n^-$-type semiconductor region 14B is arranged in contact with the $n^+$-type semiconductor region 14A. The $n^+$-type semiconductor region 14C is arranged in contact with the $n^-$-type semiconductor region 14B. That is, the $n^-$-type semiconductor region 14B is arranged between the $n^+$-type semiconductor region 14A and the $n^+$-type semiconductor region 14C. The $n^-$-type semiconductor region 14B is a diffusion layer having a lower impurity concentration and higher resistance than the $n^+$-type semiconductor regions 14A and 14C.

Extension regions 13B and 14D are formed between the $n^+$-type semiconductor region (source region) 13A and the $n^+$-type semiconductor region (drain region) 14A, which include an $n^-$-type semiconductor region having a lower impurity concentration than the $n^+$-type semiconductor regions. The extension regions 13B and 14D have a lightly-doped drain (LDD) structure. A gate insulating film 15 is formed on the p-type semiconductor substrate 11 between the $n^+$-type semiconductor region 13A and the $n^+$-type semiconductor region 14A. A gate electrode 16 is formed on the gate insulating film 15. A sidewall insulating film 15A is formed on the side surface of the gate electrode 16.

Silicide (salicide) layers 17 are formed on the surface region of the $n^+$-type semiconductor region 13A, the surface region of the $n^+$-type semiconductor region 14A, the surface region of the $n^+$-type semiconductor region 14C, and the gate electrode 16. No silicide layer is formed on the surface region of the $n^-$-type semiconductor region 14B. The $n^-$-type semiconductor region 14B having no silicide (salicide) layer will be referred to as a salicide block region hereinafter.

As the silicide layer 17, a refractory metal silicide layer formed by making a refractory metal such as molybdenum (Mo), tungsten (W), titanium (Ti), Cobalt (Co), or Nickel (Ni) react with silicon is used. The silicide (salicide) layer 17 is manufactured by the following method. After the gate electrode 16, source region, and drain region are formed, the surface of the $n^-$-type semiconductor region 14B is protected by a mask material, and a refractory metal is deposited on the p-type semiconductor substrate 11. Annealing is performed to cause silicon to react with the refractory metal. After that, an unreacted refractory metal is removed to leave the refractory metal silicide layer on the $n^+$-type semiconductor region 13A, $n^+$-type semiconductor region 14A, and $n^+$-type semiconductor region 14C.

A contact plug 18 is formed on the $n^+$-type semiconductor region 13A serving as the source region. A contact plug 19 is formed on the $n^+$-type semiconductor region 14C serving as the drain region.

In the nMOS transistor having the above-described structure, a channel having a channel width W is formed in the p-type semiconductor substrate 11 under the gate insulating film 15 between the n⁺-type semiconductor region 13A and the n⁺-type semiconductor region 14A. A width WSB of the salicide block region (n⁻-type semiconductor region 14B) in the channel width direction is set smaller than the channel width W of the nMOS transistor. That is, the width WSB of the salicide block region in the channel width direction is smaller than the width of the n⁺-type semiconductor region 13A and n⁺-type semiconductor region 14A in the channel width direction. In other words, the channel width of the channel formed in the p-type semiconductor substrate 11 between the n⁺-type semiconductor region 13A and the n⁺-type semiconductor region 14A is larger than the width of the n⁻-type semiconductor region 14B in the channel width direction. In addition, since the n⁻-type semiconductor region 14B in the salicide block region has a lightly-doped drain (LDD) structure with a low impurity concentration, a resistance Rsb of the salicide block region can be increased in a smaller area than an n⁺-type semiconductor region with a high impurity concentration. Hence, the resistance Rsb can be set to a desired value.

In the semiconductor device of the first embodiment, the drain region is partially formed by the n⁻-type semiconductor region 14B. No silicide layer is formed on the n⁻-type semiconductor region 14B. The width of the n⁻-type semiconductor region 14B in the channel width direction is smaller than the channel width of the nMOS transistor. With this structure, the electric resistance of the drain region can be increased. Hence, the electric resistance of the drain region, which decreases along with size reduction of a transistor, can be maintained at a predetermined value or more.

In the drain region in contact with the element isolation region (STI) 12, the width WSB of the n⁻-type semiconductor region 14B in the channel width direction is smaller than the channel width W of the nMOS transistor, as shown in FIGS. 1 and 3. For this reason, even when an overcurrent generated by a surge flows from the contact plug 19 on the drain region, current crowding generated at the end of the drain region in contact with the element isolation region 12 can be relaxed near the gate electrode 16. With this structure, the breakdown voltage to electro-static destroy (ESD) in the protection element formed from the nMOS transistor can be increased.

FIG. 4 shows the circuit structure of a semiconductor device including the protection element according to the first embodiment of the present invention. This semiconductor device includes a protection element 20 having a finger structure formed from a plurality of nMOS transistors, a pad 21 to which an external signal is input, and an internal circuit 22 having a predetermined function. The protection element 20 having the finger structure is connected between the pad 21 and the internal circuit 22. Drains D of the plurality of nMOS transistors are connected to a node between the pad 21 and the internal circuit 22. Gates G and sources S are connected to a ground potential Vss.

In the protection element with the finger structure, the current flowing to the protection element reaches a breakdown current Is after some MOS transistors are turned on before the remaining MOS transistors are turned on, the breakdown current Is flows to all the nMOS transistors in the ON state and destroys them. To protect the protection circuit from such destruction, the plurality of MOS transistors included in the protection circuit must uniformly be turned on to distribute the current flowing into the protection element to the plurality of nMOS transistors.

FIG. 5 is a graph showing the current vs. voltage characteristic of the protection element 20 with the finger structure. In the protection element with the finger structure indicated by the one-dot dashed line in FIG. 5, some of the plurality of nMOS transistors with the finger structure are turned on due to the floating effect of the substrate. As described above, when the current flowing to the protection element reaches the breakdown current Is, some nMOS transistors in the ON state are destroyed because the remaining nMOS transistors are not ON.

To uniformly turn on the nMOS transistors in the protection element 20 with the finger structure, the current flowing to the nMOS transistors upon applying the trigger voltage Vt1 to the drain must be lower than the breakdown current Is, as indicated by the solid line in FIG. 5. In other words, after some nMOS transistors in the protection element 20 with the finger structure are turned on before the current flowing to the nMOS transistors in ON state reaches the breakdown current Is, the voltage Vt1 must be lower to turn on the remaining nMOS transistors. To do this, the resistance Rsb of the salicide block region must be a predetermined value or more, e.g., 300 Ω·μm or more, as indicated by $$Rsb > (Vt1 - Vh)/(Is - Ih) \approx 300 \ \Omega \cdot \mu m \quad (1)$$

wherein the difference between the voltage Vt1 and a sustain voltage Vh is 2 V, and the breakdown current Is per unit width of the nMOS transistor is 7 mA/μm.

In this case, when the resistance Rsb of the salicide block region is 300 Ω·μm or more, the nMOS transistors in the protection element 20 with the finger structure can uniformly be turned on even when an overcurrent is generated by a surge. For this reason, destruction of the nMOS transistors in the protection element 20 can be prevented.

As described above, when the protection element including the nMOS transistor of the first embodiment is used, before the breakdown current Is flows to some nMOS transistors turned on at the initial stage, the remaining nMOS transistors can be turned on even when an overcurrent flows due to electrostatic discharge. As described above, when the plurality of nMOS transistors are uniformly turned on, the current flowing into the protection element can be distributed, and destruction of the protection element can be prevented. Hence, the resistance (e.g., ESD resistance) of the protection element to the overcurrent and overvoltage can be increased.

Second Embodiment

A semiconductor device including a protection element according to the second embodiment of the present invention will be described next. The same reference numerals as in the arrangement of the first embodiment denote the same parts in the second embodiment, and a description thereof will be omitted.

Figure 6:
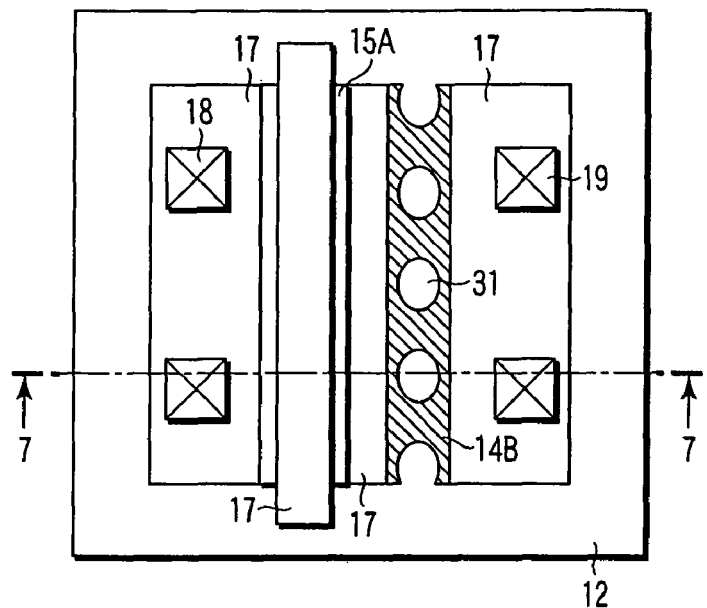
FIG. 6 is a plan view showing the structure of a semiconductor device according to a second embodiment of the present invention.
Figure 7:
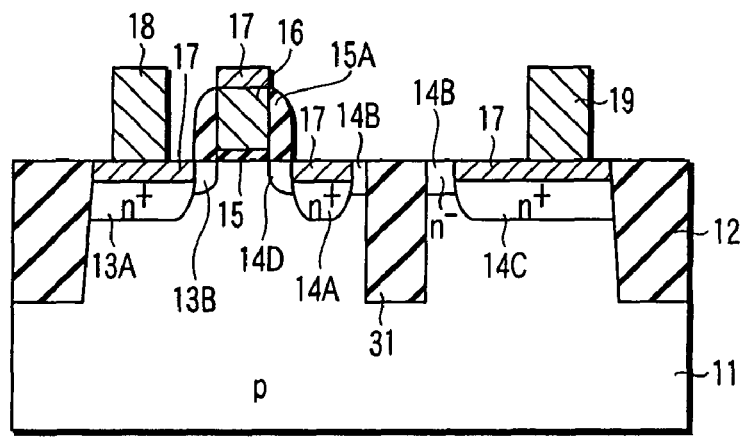
FIG. 7 is a sectional view taken along a line 7-7 in the semiconductor device according to the second embodiment.

FIG. 6 is a plan view showing the structure of an nMOS transistor included in the protection element according to the second embodiment. FIG. 7 is a sectional view taken along a line 7-7 in the nMOS transistor. In the second embodiment, an insulating region is formed in the salicide block region, thereby increasing the resistance of the salicide block region.

As shown in FIGS. 6 and 7, an n⁻-type semiconductor region 14B serving as a salicide block region is formed between an n⁺-type semiconductor region 14A and an n⁺-type semiconductor region 14C. A plurality of island-shaped insulating regions 31 are formed in the n⁻-type semiconductor region 14B at a predetermined interval. The insulating regions 31 are formed by burying an insulating film such as a silicon oxide film in a trench formed in the n⁻-type semiconductor region 14B and p-type semiconductor substrate 11. To form the insulating regions 31, for example, the same process as in formation of an element isolation region 12 can be used.

In the nMOS transistor having the above-described structure, the salicide block region (n⁻-type semiconductor region 14B) has an LDD structure with a low impurity concentration. In addition, the insulating regions 31 are formed in the n⁻-type semiconductor region 14B. With this structure, a resistance Rsb of the salicide block region can be increased in a small area and set to a desired value.

In the second embodiment, the drain region is partially formed by the n⁻-type semiconductor region 14B. No silicide layer is formed on the n⁻-type semiconductor region 14B. The insulating regions 31 are formed in the n⁻-type semiconductor region 14B. With this structure, the resistance Rsb of the salicide block region is increased. Hence, the electric resistance of the drain region can be increased. The electric resistance of the drain region, which decreases along with size reduction of a transistor, can be maintained at a predetermined value or more. As a result, even when an overcurrent flows into a protection element 20 with a finger structure shown in FIG. 4 due to, e.g., electrostatic discharge, the plurality of nMOS transistors can uniformly be turned on, and the current flowing into the protection element can be distributed. Destruction of the protection element can be prevented, and the resistance (e.g., ESD resistance) of the protection element to the overcurrent and overvoltage can be increased.

In the drain region in contact with the element isolation region (STI) 12, the insulating regions 31 are formed at the boundary between the n⁻-type semiconductor region 14B and the element isolation region 12, as shown in FIG. 6. For this reason, even when an overcurrent generated by a surge flows from a contact plug 19 on the drain region, current crowding generated at the end of the drain region in contact with the element isolation region 12 can be relaxed near a gate electrode 16. Hence, the resistance (e.g., ESD resistance) of the protection element to the overcurrent and overvoltage can further be increased.

In the example shown in FIG. 6, the width of the salicide block region in the channel width direction equals the channel width of the nMOS transistor. As in the first embodiment, the width of the salicide block region in the channel width direction may be smaller than the channel width of the nMOS transistor.

Third Embodiment

A semiconductor device including a protection element according to the third embodiment of the present invention will be described next. The same reference numerals as in the arrangement of the first embodiment denote the same parts in the third embodiment, and a description thereof will be omitted.

Figure 8:
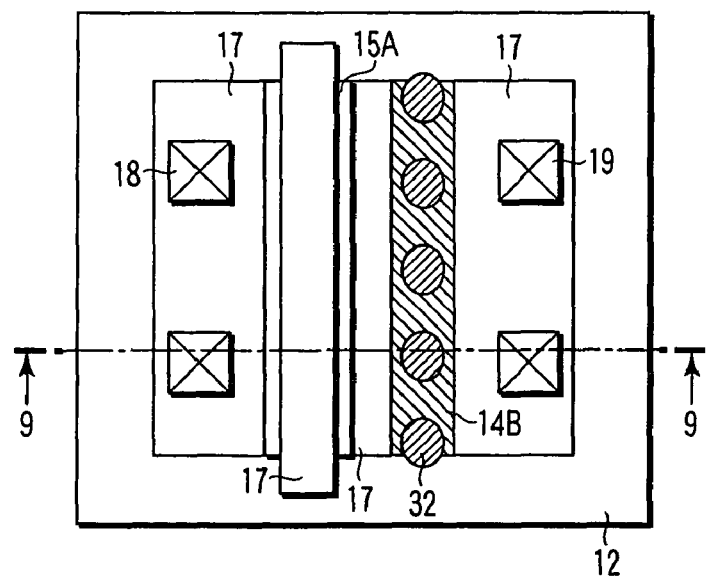
FIG. 8 is a plan view showing the structure of a semiconductor device according to a third embodiment of the present invention.

FIG. 8 is a plan view showing the structure of an nMOS transistor included in the protection element according to the third embodiment. FIG. 9 is a sectional view taken along a line 9-9 in the nMOS transistor. In the third embodiment, an impurity region of a conductivity type opposite to that of the drain region is formed, thereby increasing the resistance of the salicide block region.

As shown in FIGS. 8 and 9, an n⁻-type semiconductor region 14B serving as a salicide block region is formed between an n⁺-type semiconductor region 14A and an n⁺-type semiconductor region 14C. A plurality of island-shaped p⁺-type semiconductor regions 32 are formed in the n⁻-type semiconductor region 14B at a predetermined interval. The p⁺-type semiconductor regions 32 are formed by introducing a p-type impurity (e.g., boron) of a conductivity type opposite to that of the drain region (n-type) into a plurality of predetermined regions in the n⁻-type semiconductor region 14B.

The p-type impurity is introduced by, e.g., ion implantation. Ion implantation to form the p⁺-type semiconductor regions 32 can be done by using an ion implantation process (p pocket ion implantation process) to prevent the short channel effect. The ion implantation process to form the p⁺-type semiconductor regions 32 and prevent the short channel effect is executed after the source region and drain region are formed, i.e., after the n⁻-type semiconductor region 14B is formed.

In the nMOS transistor having the above-described structure, the salicide block region (n⁻-type semiconductor region 14B) has an LDD structure with a low impurity concentration. In addition, the p⁺-type semiconductor regions 32 are formed in the n⁻-type semiconductor region 14B. With this structure, a resistance Rsb of the salicide block region can be increased in a small area and set to a desired value.

In the third embodiment, the drain region is partially formed by the n⁻-type semiconductor region 14B. No silicide layer is formed on the n⁻-type semiconductor region 14B. The p⁺-type semiconductor regions 32 are formed in the n⁻-type semiconductor region 14B. With this structure, the resistance Rsb of the salicide block region is increased. Hence, the electric resistance of the drain region can be increased. The electric resistance of the drain region, which decreases along with size reduction of a transistor, can be maintained at a predetermined value or more. As a result, even when an overcurrent flows into a protection element 20 with a finger structure shown in FIG. 4 due to, e.g., electrostatic discharge, the plurality of nMOS transistors can uniformly be turned on, and the current flowing into the protection element can be distributed. Destruction of the protection element can be prevented, and the resistance (e.g., ESD resistance) of the protection element to the overcurrent and overvoltage can be increased.

In the drain region in contact with an element isolation region (STI) 12, the p⁺-type semiconductor regions 32 are formed at the boundary between the n⁻-type semiconductor region 14B and the element isolation region 12, as shown in FIG. 8. For this reason, even when an overcurrent generated by a surge flows from a contact plug 19 on the drain region, current crowding generated at the end of the drain region in contact with the element isolation region 12 can be relaxed near a gate electrode 16. Hence, the resistance (e.g., ESD resistance) of the protection element to the overcurrent and overvoltage can further be increased.

A p-type impurity may be ion-implanted into the n⁻-type semiconductor region 14B serving as a salicide block region as a counter. In this case, the resistance Rsb of the salicide block region can be increased, and the same effect as described above can be obtained.

In the example shown in FIG. 8, the width of the salicide block region in the channel width direction equals the channel width of the nMOS transistor. As in the first embodiment, the width of the salicide block region in the channel width direction may be smaller than the channel width of the nMOS transistor.

Fourth Embodiment

A semiconductor device including a protection element according to the fourth embodiment of the present invention will be described next. The same reference numerals as in the arrangement of the first embodiment denote the same parts in the fourth embodiment, and a description thereof will be omitted.

FIG. 10 is a plan view showing the structure of an nMOS transistor included in the protection element according to the fourth embodiment. FIG. 11 is a sectional view taken along a line 11-11 in the nMOS transistor. In the fourth embodiment, the length of the salicide block region in the channel length direction is set larger than the distance between the gate electrode and the salicide block region, thereby increasing the resistance of the salicide block region.

As shown in FIGS. 10 and 11, an n$^-$-type semiconductor region 14B serving as a salicide block region is formed between an n$^+$-type semiconductor region 14A and an n$^+$-type semiconductor region 14C. A length Lsb of the n$^-$-type semiconductor region 14B in the channel length direction is larger than a distance SBGC between a gate electrode 16 and the n$^-$-type semiconductor region 14B.

In the nMOS transistor having the above-described structure, the salicide block region (n$^-$-type semiconductor region 14B) has an LDD structure with a low impurity concentration. In addition, the length Lsb of the n$^-$-type semiconductor region 14B in the channel length direction is set larger than the distance SBGC between the gate electrode 16 and the n$^-$-type semiconductor region 14B. With this structure, a resistance Rsb of the salicide block region can be increased and set to a desired value.

In the fourth embodiment, the drain region is partially formed by the n$^-$-type semiconductor region 14B. No silicide layer is formed on the n$^-$-type semiconductor region 14B. The length Lsb of the n$^-$-type semiconductor region 14B in the channel length direction is formed larger than the distance SBGC. With this structure, the resistance Rsb of the salicide block region is increased. Hence, the electric resistance of the drain region can be increased. The electric resistance of the drain region, which decreases along with size reduction of a transistor, can be maintained at a predetermined value or more. As a result, even when an overcurrent flows into a protection element 20 with a finger structure shown in FIG. 4 due to, e.g., electrostatic discharge, the plurality of nMOS transistors can uniformly be turned on, and the current flowing into the protection element can be distributed. Destruction of the protection element can be prevented, and the resistance (e.g., ESD resistance) of the protection element to the overcurrent and overvoltage can be increased.

In the drain region in contact with an element isolation region (STI) 12, the length Lsb of the salicide block region in the channel length direction is formed larger than the distance SBGC between the gate electrode and the salicide block region, as described above. For this reason, even when an overcurrent generated by a surge flows from a contact plug 19 on the drain region, current crowding generated at the end of the drain region in contact with the element isolation region 12 can be relaxed near a gate electrode 16. Hence, the resistance (e.g., ESD resistance) of the protection element to the overcurrent and overvoltage can further be increased.

In the example shown in FIG. 10, the width of the salicide block region in the channel width direction equals the channel width of the nMOS transistor. As in the first embodiment, the width of the salicide block region in the channel width direction may be smaller than the channel width of the nMOS transistor.

Fifth Embodiment

A semiconductor device including a protection element according to the fifth embodiment of the present invention will be described next. The same reference numerals as in the arrangement of the first embodiment denote the same parts in the fourth embodiment, and a description thereof will be omitted.

Figure 12:
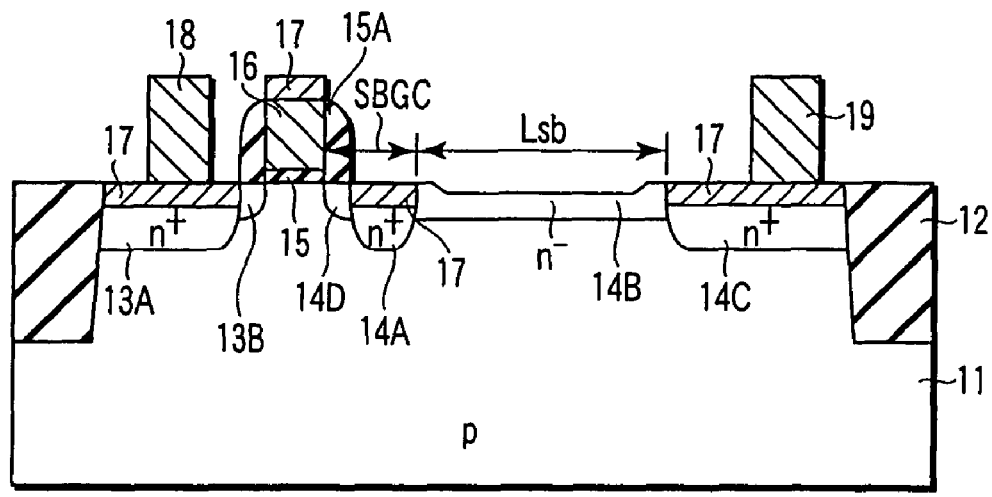
FIG. 12 is a sectional view taken along a line 12-12 in the semiconductor device according to the fifth embodiment.

The structure of the nMOS transistor included in the protection element of the fifth embodiment is the same as that shown in the plan view of FIG. 10. FIG. 12 is a sectional view taken along a line 12-12 in the nMOS transistor shown in FIG. 10. In the fifth embodiment, the thickness of the layer of an n$^-$-type semiconductor region 14B serving as a salicide block region in the fourth embodiment is decreased, thereby increasing the resistance of the salicide block region.

As shown in FIGS. 10 and 12, the n$^-$-type semiconductor region 14B serving as a salicide block region is formed between an n$^+$-type semiconductor region 14A and an n$^+$-type semiconductor region 14C. A length Lsb of the n$^-$-type semiconductor region 14B in the channel length direction is larger than a distance SBGC between a gate electrode 16 and the n$^-$-type semiconductor region 14B. In addition, the layer of the n$^-$-type semiconductor region 14B is thinner than in the fourth embodiment. To thin the layer of the n$^-$-type semiconductor region 14B, only the n$^-$-type semiconductor region 14B is opened by using a mask material, and the upper layer of the n$^-$-type semiconductor region 14B is etched by, e.g., RIE. With this process, the n$^-$-type semiconductor region 14B is made thinner than extension regions 13B and 14D formed from n$^-$-type semiconductor regions between an n$^+$-type semiconductor region (source region) 13A and the n$^+$-type semiconductor region (drain region) 14A.

In the nMOS transistor having the above-described structure, the salicide block region (n$^-$-type semiconductor region 14B) has an LDD structure with a low impurity concentration. In addition, the n$^-$-type semiconductor region 14B is thin. With this structure, a resistance Rsb of the salicide block region can be increased and set to a desired value.

In the fifth embodiment, the drain region is partially formed by the n$^-$-type semiconductor region 14B. No silicide layer is formed on the n$^-$-type semiconductor region 14B. The length Lsb of the n$^-$-type semiconductor region 14B in the channel length direction is set larger than the distance SBGC. The n$^-$-type semiconductor region 14B is made thinner than the extension regions. With this structure, the resistance Rsb of the salicide block region is increased. Hence, the electric resistance of the drain region can be increased. The electric resistance of the drain region, which decreases along with size reduction of a transistor, can be maintained at a predetermined value or more. As a result, even when an overcurrent flows into a protection element 20 with a finger structure shown in FIG. 4 due to, e.g., electrostatic discharge, the plurality of nMOS transistors can uniformly be turned on, and the current flowing into the protection element can be distributed. Destruction of the protection element can be prevented, and the resistance (e.g., ESD resistance) of the protection element to the overcurrent and overvoltage can be increased.

In the drain region in contact with an element isolation region (STI) 12, the length Lsb of the salicide block region in the channel length direction is formed larger than the distance SBGC between the gate electrode and the salicide block region, as described above. In addition, the salicide block region is formed thinner than the extension regions. For this reason, even when an overcurrent generated by a surge flows from a contact plug 19 on the drain region, current crowding generated at the end of the drain region in contact with the element isolation region 12 can be relaxed near a gate electrode 16. Hence, the resistance (e.g., ESD resistance) of the protection element to the overcurrent and overvoltage can further be increased.

In the example shown in FIG. 10, the width of the salicide block region in the channel width direction equals the channel width of the nMOS transistor. As in the first embodiment, the width of the salicide block region in the channel width direction may be smaller than the channel width of the nMOS transistor.

Figure 13:
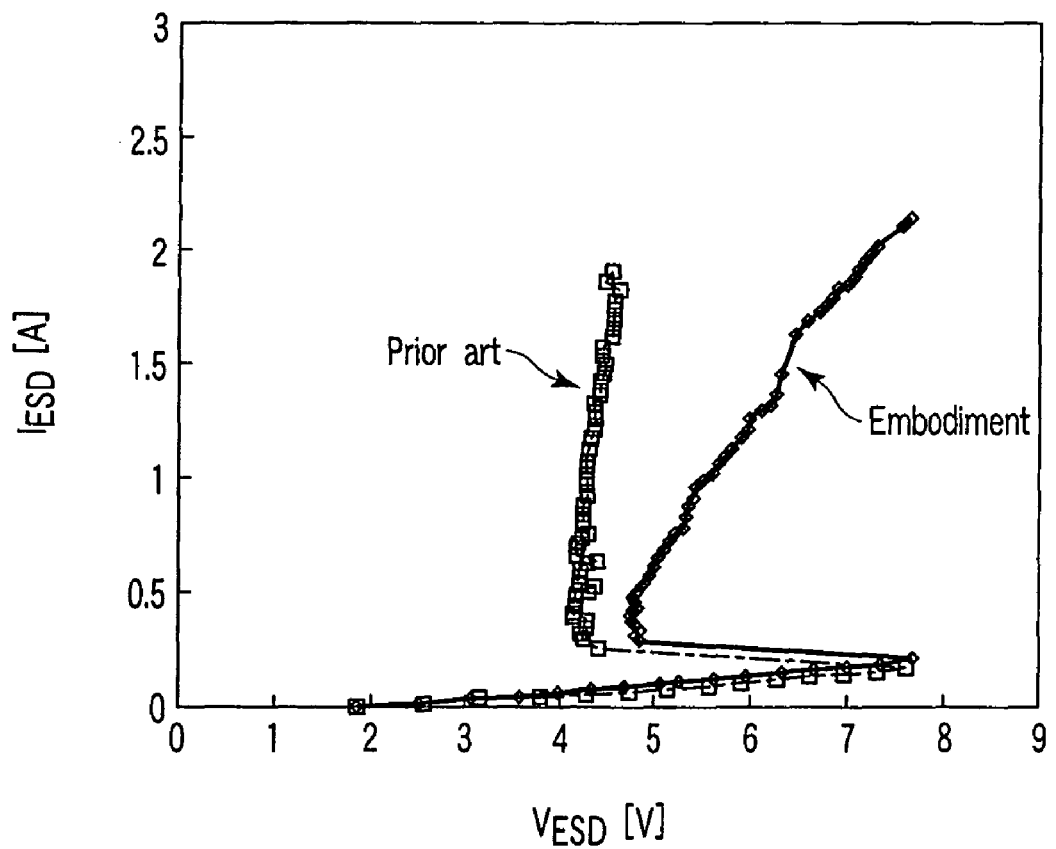
FIG. 13 is a graph showing the current vs. voltage characteristic of the semiconductor devices according to the embodiments of the present invention.

FIG. 13 shows the current vs. voltage characteristic of the semiconductor devices according to the first to fifth embodiments of the present invention. This is a measurement result obtained by using a transmission line pulse (TLP) evaluation apparatus which applies a pulse-shaped surge. In the prior art shown in FIG. 13, when an overcurrent by a surge is applied, the nMOS transistors in the protection element with the finger structure are turned on ununiformly. For this reason, the current flowing to some nMOS transistors in the protection element exceeds the breakdown current, and the nMOS transistors are destructed.

On the other hand, in the embodiments shown in FIG. 13, the resistance Rsb of the salicide block region is high, as shown in FIG. 5. Hence, even when some nMOS transistors in the protection element are turned on, the remaining nMOS transistors are also turned on before the current flowing to the nMOS transistors reaches the breakdown current. For this reason, the nMOS transistors in the protection element function without being destructed. Hence, the resistance to ESD in the protection element with the finger structure can be increased.

In the first to fifth embodiments, the nMOS transistor included in the protection element has been described. However, the present invention is not limited to this and can also be applied to a p-channel MOS field effect transistor.

According to an embodiment of the present invention, a semiconductor device capable of maintaining the resistance of the drain (or source) region, which decreases along with the progress of the micropatterning technology, at a predetermined value or more can be provided. According to another embodiment of the present invention, a semiconductor device which includes a protection element capable of preventing destruction of transistors in the protection element and increasing the resistance (ESD resistance) to electro-static destroy can be provided.

Each of the above embodiments can independently be practiced. However, they may also be appropriately combined. The embodiments incorporate inventions of various stages, and inventions of various stages can be extracted by appropriately combining a plurality of constituent elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
 a semiconductor substrate including an element region and an element isolation region surrounding the element region;
 a source region formed in the element region having a first width in a first direction, wherein the first direction is a gate width direction;
 a first drain region formed in the element region and apart from the source region in a second direction which is perpendicular to the first direction, the first drain region having a second width in the first direction, wherein the first width is equal in magnitude to the second width;
 a second drain region formed in the element region and apart from the first drain region in the second direction, the second drain region having a third width in the first direction, wherein the third width is equal in magnitude to the second width and the first drain region is located between the source region and the second drain region;
 a third drain region formed in the element region between the first drain region and the second drain region, the third drain region having an electrical resistivity higher than that of the source, first drain, and second drain regions, the third drain region having a fourth width in the first direction, wherein the magnitude of the fourth width is smaller than that of the first width;
 a gate insulating film formed on the element region between the source region and the first drain region;
 a gate electrode formed on the gate insulating film; and
 a silicide layer formed on and entirely covering each of the source, first drain and second drain regions, without covering the third drain region;
 wherein the semiconductor substrate has a first conductivity type,
 the source, first drain, second drain and third drain regions have a second conductivity type different from the first conductivity type,
 the source, first drain and second drain regions are equal in impurity concentration, and
 the third drain region has an impurity concentration lower than that of the source, first drain and second drain regions, wherein the third drain region has two ends along the first direction; and an element isolation region extends to a region between and in contact with the first and second drain regions at and in contact with each of the two ends of the third drain region.

2. The device according to claim 1, further comprising a sidewall insulating film formed on a side surface of the gate electrode.

3. The device according to claim 1, further comprising a contact plug formed on the silicide layer on the second drain region.

4. The device according to claim 3, further comprising a second contact plug formed on the silicide layer on the source region.

5. The device according to claim 1 wherein the semiconductor substrate includes a p-type semiconductor substrate.

6. The device according to claim 5 wherein the source region, the first drain region and the second drain region include an n+-type semiconductor region.

7. The device according to claim 6 wherein the third drain region includes an n⁻-type semiconductor region.

* * * * *